(12) United States Patent
Kishibe

(10) Patent No.: US 7,178,122 B2
(45) Date of Patent: Feb. 13, 2007

(54) SEMICONDUCTOR INTEGRATED CIRCUIT, METHOD OF DESIGNING SEMICONDUCTOR INTEGRATED CIRCUIT, AND DEVICE FOR DESIGNING THE SAME

(75) Inventor: Hiroshi Kishibe, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 373 days.

(21) Appl. No.: 10/778,362

(22) Filed: Feb. 17, 2004

(65) Prior Publication Data

US 2004/0168143 A1    Aug. 26, 2004

(30) Foreign Application Priority Data

Feb. 20, 2003    (JP)    ............... 2003-042526

(51) Int. Cl.
*G06F 17/50*    (2006.01)
(52) U.S. Cl. ...................................... 716/10
(58) Field of Classification Search ............... None
See application file for complete search history.

(56) References Cited

U.S. PATENT DOCUMENTS 5,369,595 A * 11/1994 Gould et al. ................. 716/17
5,768,146 A *  6/1998 Jassowski ...................... 716/8

FOREIGN PATENT DOCUMENTS

JP    8-87533    4/1996

\* cited by examiner

*Primary Examiner*—Leigh M. Garbowski
(74) *Attorney, Agent, or Firm*—McGinn IP Law Group, PLLC

(57) ABSTRACT

Placement is performed by using a library created by enlarging cell frames of at least one type of cells out of a plurality of types of standard cells constituted by using transistors having different characteristics for the respective types of cell. More preferably, the overlap between cells is judged by using unenlarged cell frames as adjacent boundaries for standard cells of the same type, and the overlap between cells is judged by using enlarged cell frames as adjacent boundaries for standard cells of different types. This enables automatic placement in which different types of cells are mixed.

17 Claims, 14 Drawing Sheets

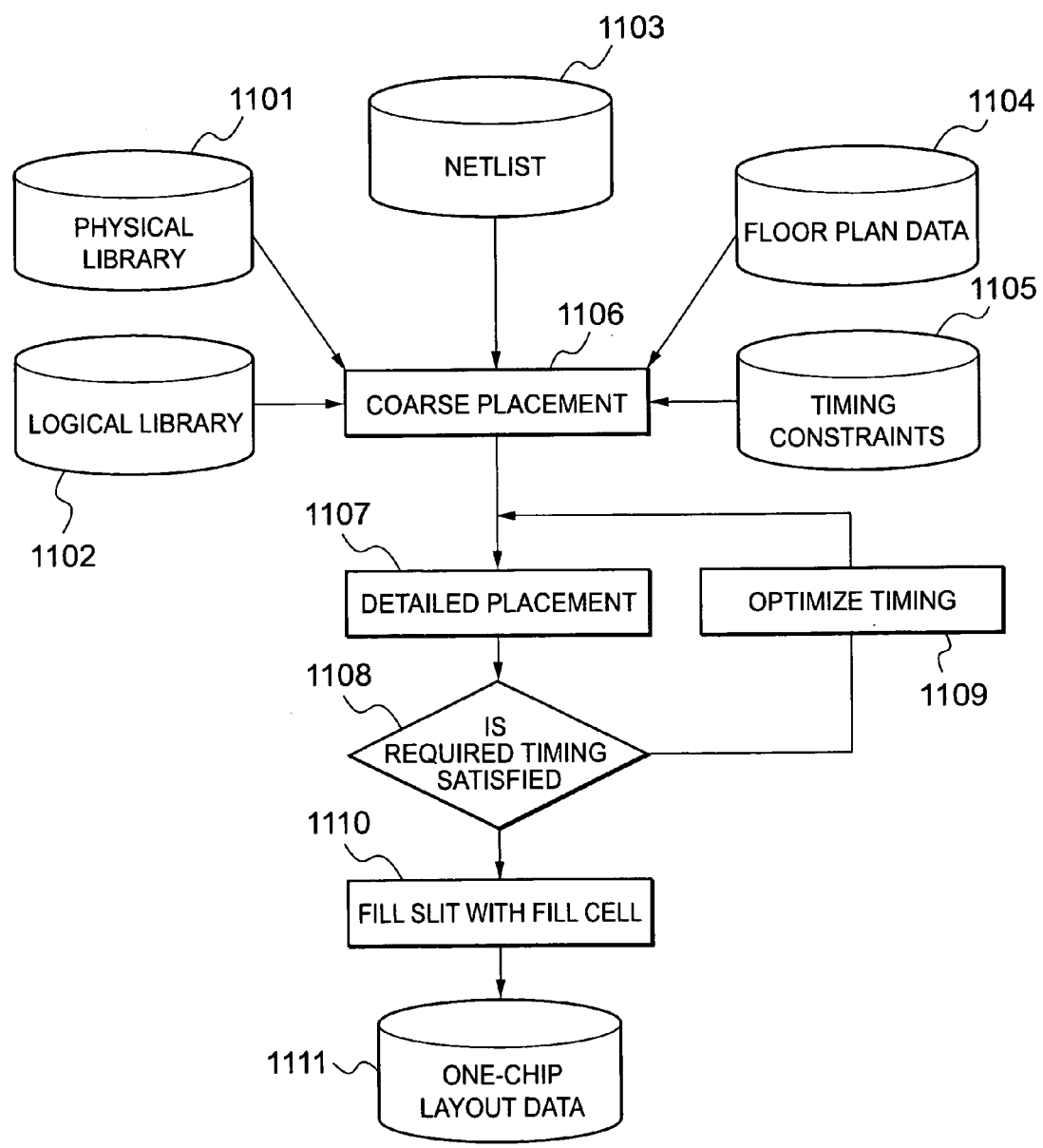

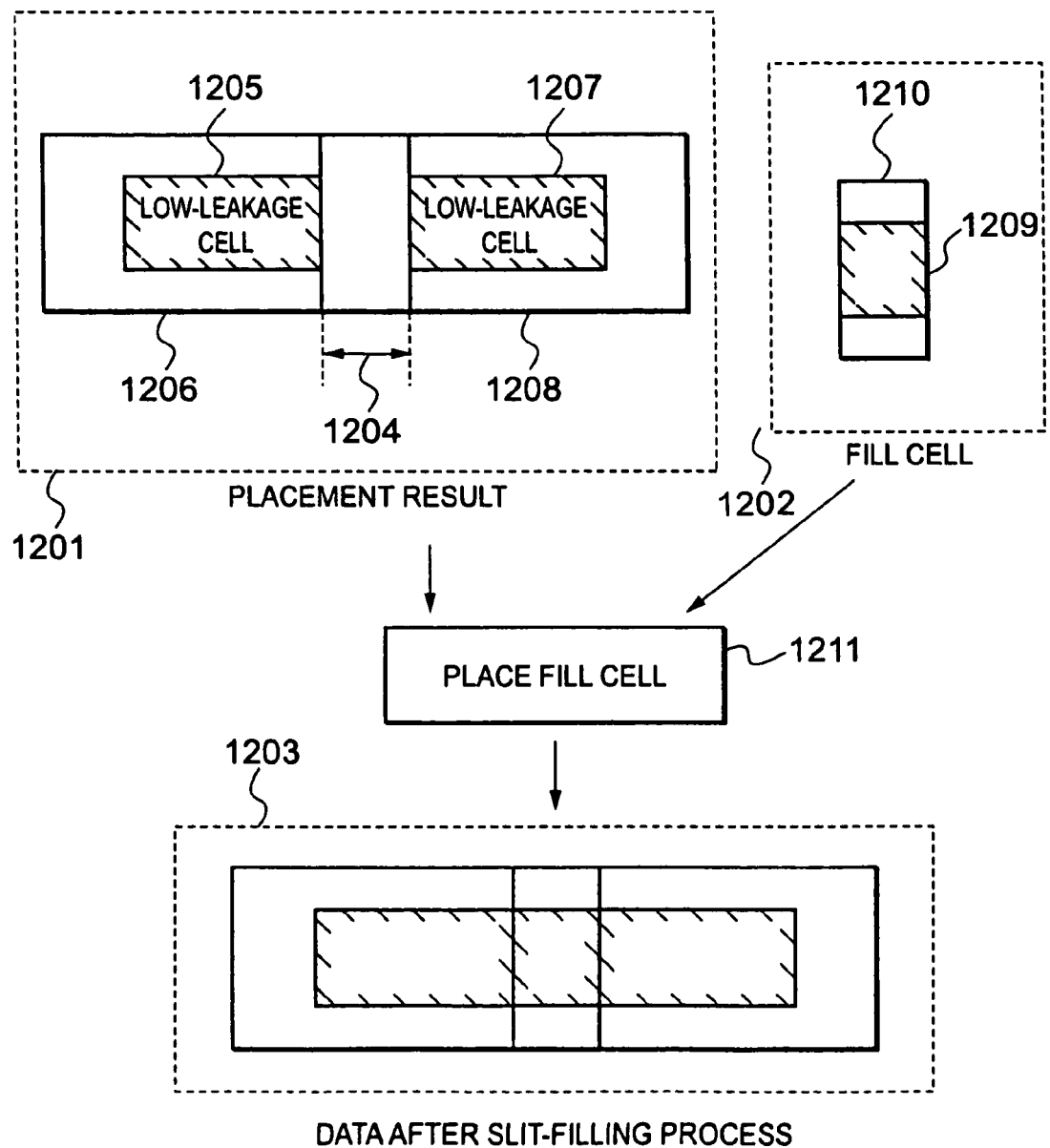

SEMICONDUCTOR INTEGRATED CIRCUIT, METHOD OF DESIGNING SEMICONDUCTOR INTEGRATED CIRCUIT, AND DEVICE FOR DESIGNING THE SAME

BACKGROUND OF THE INVENTION

1. Field of the Invention

The present invention relates to a semiconductor integrated circuit, a method of designing a semiconductor integrated circuit using automatic placement of standard cells, and a device for designing the same.

2. Description of the Prior Art

In recent years, demands for high-speed operation of semiconductor integrated circuits are increasingly being grown. However, the increase in power consumption when inoperative has to be suppressed. A designing method has been known in which high-speed transistors having high switching-speeds and slightly large leakage currents in off state and low-leakage transistors having very small leakage currents in off state and slightly low switching-speeds are used for settling the above demands. A major part of a semiconductor integrated circuit is designed by using low-leakage transistors, and a circuit portion requiring high-speed operation is designed by using high-speed transistors. A high-speed transistor has the same shape as a low-leakage transistor when viewed in a plan view, but has characteristics, e.g., the low absolute value of a threshold voltage, a thin gate insulating film, a short effective channel length, and the like. For the same gate voltage, a larger drain current can be made to flow in the high-speed transistor. Thus, the high-speed transistor has voltage-to-current characteristics different from those of the low-leakage transistor.

On the other hand, as disclosed in, for example, Japanese Unexamined Patent Publication No. Hei 8(1996)-87533, automatic placement and automatic wiring are broadly used in which standard cells are used for making layout design more efficient. The designing method shown in FIG. 1 has been used in the case where a plurality of types of transistors, such as high-speed transistors and low-leakage transistors, having different voltage-to-current characteristics are integrated on one chip using the automatic placement of standard cells.

In FIG. 1, first, in Step 1302, for design using cells of a high-speed type in a timing-critical circuit portion requiring high-speed operation, the entire netlist 1301 is divided into the following modules: a module of a portion where operation timing is critical, for example, for a reason such that a signal has to pass through a large number of stages of gates for one clock, or the like, and a module (top module 1308) of the other portion. Here, a cell of a high-speed type means a cell constituted by high-speed transistors. Hereinafter, a cell of a high-speed type is referred to as a high-speed cell, and a cell constituted by a low-leakage transistor cell is referred to as a low-leakage cell. A high-speed cell library 1305 is a library of high-speed cells, and a low-leakage cell library 1310 is a library of low-leakage cells.

In a placement step 1306, cells are placed based on a netlist of a timing-critical module 1303 using floor plan data 1304, which is data representing a placeable area, and the high-speed cell library 1305. The timing-critical module 1303 in which the placement step has been completed is stored in a timing-critical module library 1307.

In a placement step 1311, the cells are placed based on a netlist of the top module 1308 using floor plan data 1309 and the low-leakage cell library 1310. Moreover, the timing-critical module is placed by using the timing-critical module library 1307, thus creating layout data 1312 for the whole chip. FIG. 2 is a diagram schematically showing cell placement realized by the above designing method.

Incidentally, the timing-critical circuit portion constituted by high-speed cells and the other circuit portion constituted by low-leakage cells need to be placed away from each other by a certain distance. This is because a mask margin is required so that a process (e.g., ion implantation, etching, and the like) specific to transistors of one type may not affect structures and characteristics of transistors of the other type in a diffusion process since high-speed transistors for a high-speed cell and low-leakage transistors for a low-leakage cell are different from each other in terms of structure and characteristics.

Accordingly, in the aforementioned designing method, the outline of each macro constituting the top module becomes a block constituted by a combination of rectangles. Moreover, for improving the placement quality of the top module, a timing-critical circuit (the timing-critical module in FIG. 1) is often placed in the peripheral area of the chip or around another large-scale macro. In the case where the timing-critical circuit portion is placed in the peripheral area of the chip or around another large-scale macro, the wiring lengths of an input signal line and an output signal line are lengthened, and a delay is increased. Therefore, there are many cases where the effect of using the high-speed cell library is impaired.

As described above, in the known designing method, since a high-speed cell macro 1402 (corresponding to the timing-critical module in FIG. 1) constituted by high-speed cells and a low-leakage cell macro 1401 (corresponding to the top module in FIG. 1) constituted by low-leakage cells are respectively placed as individual blocks, the effect of using the high-speed cell library has not been sufficiently exerted.

SUMMARY OF THE INVENTION

The present invention has been accomplished in light of the above-described circumstances. An object of the present invention is to provide a semiconductor integrated circuit, a method of designing a semiconductor integrated circuit and a device for designing the same, in which a plurality of types of cells, e.g., high-speed cells and low-leakage cells, constituted by transistors having different characteristics for the respective types of cell can be placed in a mixed manner.

A method of designing a semiconductor integrated circuit of the present invention is a method of designing a semiconductor integrated circuit having a plurality of types of cells constituted by using transistors having different characteristics for the respective types of cell, the method is characterized in comprising the steps of: creating at least one type of cell out of the plurality of types of cells, as a cell having a first cell boundary, which indicates a cell frame defined including polygon patterns of transistors, wirings between the transistors and terminals, and a second cell boundary obtained by enlarging the first cell boundary in four directions; and placing the cells so that outermost cell boundaries of different types of cells do not overlap one another.

Here, it is preferred that the step of placing the cells comprise the substeps of: executing coarse placement of the cells based on the netlist and the constraint information; and eliminating an overlap, if there are cells of which outermost cell boundaries overlap in a result of the coarse placement, by moving at least one of the relevant cells.

Alternatively, the following is also preferable: the plurality of types of cells are stored in a single logical library while being distinguished depending on cell attributes; a cell in which a second cell boundary is defined corresponding to the cell attributes is created and stored in a physical library; and the step of placing the cells includes the substeps of: coarsely placing the plurality of cells each having the first cell boundary and the second cell boundary based on the netlist and the constraint information; eliminating an overlap of the first cell boundaries, if there are cells which have the same cell attributes and of which first cell boundaries overlap, by moving at least one of the relevant cells; and eliminating an overlap of the second cell boundaries, if there are cells which have different cell attributes and of which second cell boundaries overlap, by moving at least one of the relevant cells.

A device for designing a semiconductor integrated circuit of the present invention is a device for designing a semiconductor integrated circuit having a plurality of types of cells constituted by using transistors having different characteristics for the respective types of cell, the device is characterized in comprising, a cell library in which the plurality of types of cells are stored while having cell attributes distinguished from one another and having first cell boundaries indicating cell frames corresponding to the cell attributes and second cell boundaries obtained by enlarging the first cell boundaries in four directions, and placement means having functions: in putting a netlist and constraint information to execute placement of the cells using cell data stored in the library; eliminating an overlap of the first cell boundaries, if there are cells which have the same cell attributes and of which first cell boundaries overlap, by moving at least one of the relevant cells; and eliminating an overlap of the second cell boundaries, if there are cells which have different cell attributes and of which second cell boundaries overlap, by moving at least one of the relevant cells.

A semiconductor integrated circuit of the present invention is a semiconductor integrated circuit comprising: at least one first cell (e.g., low-leakage cell) each including at least one first transistor (e.g., low-leakage transistor); and at least one second cell (e.g., high-speed cell) each including at least one second transistor (e.g., high-speed transistor); wherein the first transistor and the second transistor have characteristics different from each other; wherein the first cell and the second cell are apart from each other keeping a distance equal to or larger than a predetermined distance; and wherein the first cell and the second cell are arranged in a mixed manner.

The above and other related objects and features of the present invention will clearly appear from a description based on the accompanying drawings and novel matters pointed out in claims.

BRIEF DESCRIPTION OF THE DRAWINGS

For further understanding drawings used in detailed description of the present invention, each drawing will be briefly described.

FIG. 14 is a design flowchart according to a third embodiment of the present invention.

FIG. 15 is a diagram for explaining a fill-cell filling step in the third embodiment.

DETAILED DESCRIPTION OF THE PREFERRED EMBODIMENTS

Hereinafter, preferred embodiments of the present invention will be described in detail with reference to the accompanying drawings. Note that the description below is for showing the embodiments of the present invention but that the present invention is not interpreted as limited to the description below.

Figure 1:
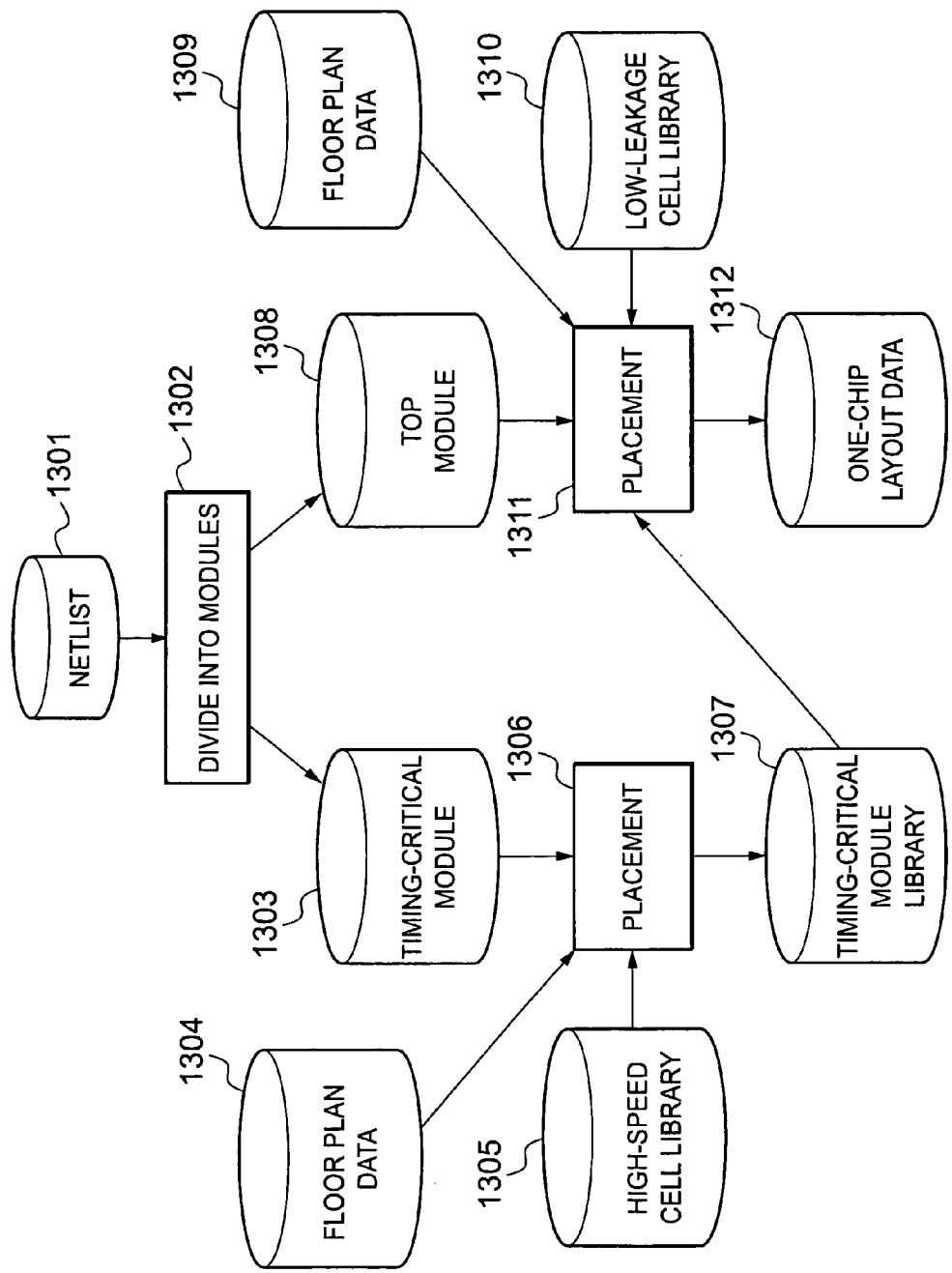
FIG. 1 is a flowchart for explaining a known designing method in the case where a plurality of types of transistors having different characteristics are integrated on one chip.
Figure 2:
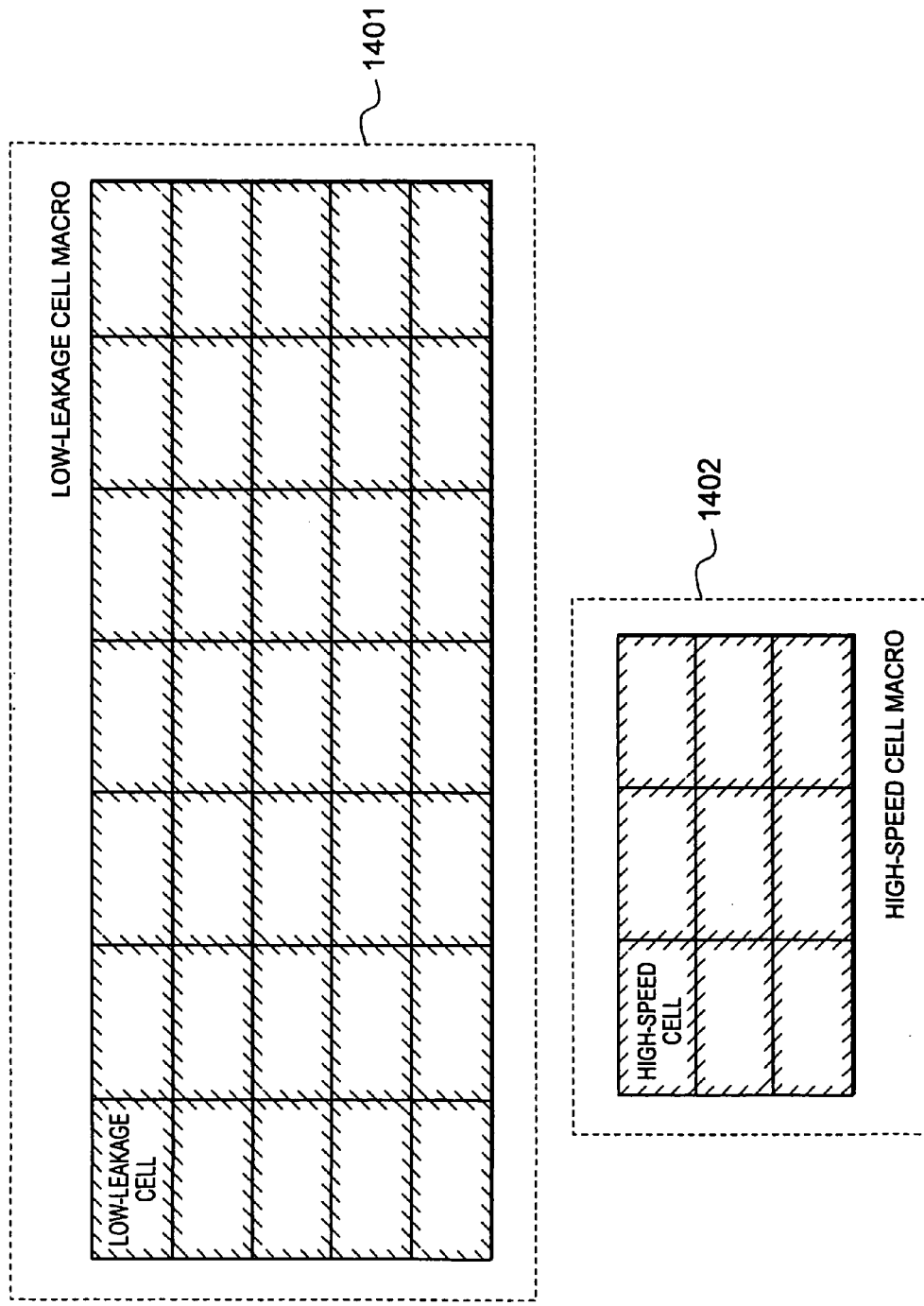
FIG. 2 is a pattern diagram of cell placement in a semiconductor integrated circuit realized by the known designing method.
Figure 3:
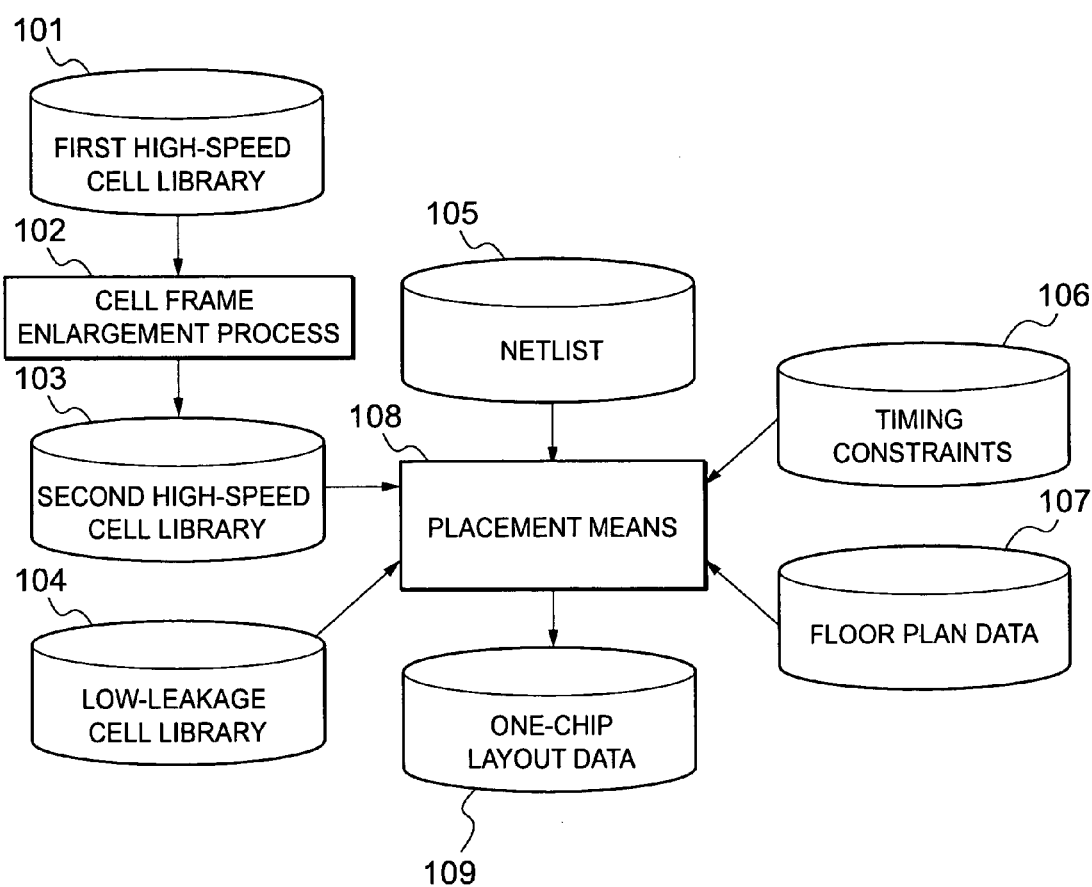
FIG. 3 is a diagram showing the configuration of a designing device according to a first embodiment of the present invention.

FIG. 3 is a diagram showing the configuration of a designing device of a first embodiment of the present invention. In the present embodiment, a second high-speed cell library 103, a low-leakage cell library 104, a netlist 105 in which circuit connections are described by using cells stored in these libraries, a floor plan data 106 which is data representing a placeable area, and timing constraints 107 which defines operation timing of a circuit are inputted into placement means 108, and the placement means 108 is caused to execute a placement step, thus creating chip layout data 109. In the second high-speed cell library 103, cells of which cell frames are enlarged are stored corresponding to the respective cells stored in a first high-speed cell library 101.

A high-speed cell means a cell constituted by using high-speed transistors having high switching speeds and slightly large leakage currents in off state, and a low-leakage cell means a cell constituted by using low-leakage transistors having very low leakage currents in off state and slightly low switching speeds. A high-speed transistor has the same shape as a low-leakage transistor when viewed in a plan view, but has characteristics, e.g., the low absolute value of a threshold voltage, a thin gate insulating film, a short effective channel length, and the like. For the same gate voltage, a larger drain current can be made to flow in the high-speed transistor. Thus, the high-speed transistor has voltage-to-current characteristics different from those of the low-leakage transistor.

Figure 4:
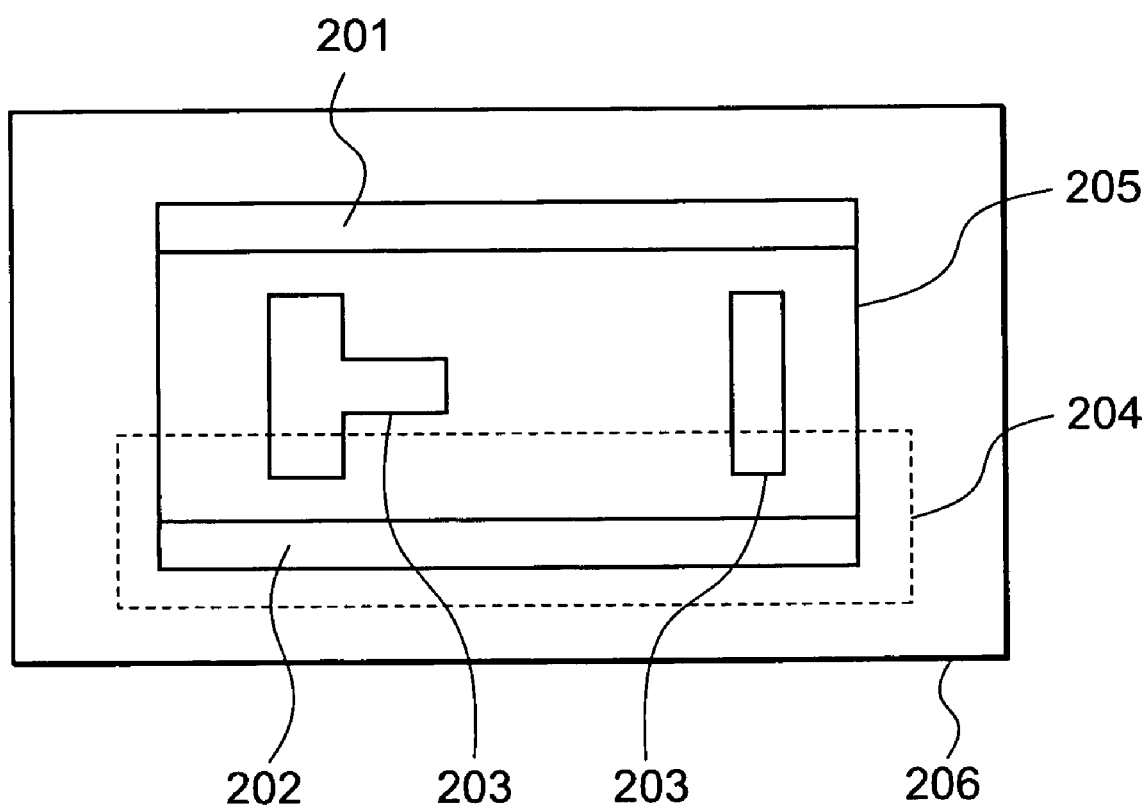
FIG. 4 is a pattern diagram showing the structure of a cell according to the first embodiment.

The cells stored in the first high-speed cell library 101 and the low-leakage cell library 104 have only first cell boundary data 205 representing original cell frames as cell frames. Referring to FIG. 4, the structures of the cells stored in the first high-speed cell library 101 and the low-leakage cell library 104 will be described. Each of the cells has a power terminal 201, a ground terminal 202, signal terminals 203, and a first cell boundary 205 indicating a cell frame. The cell frame is defined to include polygon patterns of transistors, wirings (these are not shown in FIG. 4) and terminals. Here, a well 204 is a pattern indicating, for example, an N-type well region and is usually defined to have a shape in which the well 204 protrudes from the first cell boundary 205 as indicated by dashed lines, in consideration for the connection with the well of an adjacent cell.

Next, the first embodiment of the present invention will be described in detail with reference to FIG. 3. For each cell of the first high-speed cell library 101, a cell frame enlargement process 102 is executed and a second cell boundary 206, which is a cell frame enlarged as shown in FIG. 4, is created. Each cell subjected to the cell frame enlargement process is stored in the second high-speed cell library 103. In the cell frame enlargement process 102, a first cell boundary 205 of a cell is enlarged in four directions, up, down, left, and right, thus creating a second cell boundary 206. Here, enlargement dimensions are dimensions equal to or larger than a mask margin required when transistors having different characteristics are individually fabricated through a diffusion process. All dimensions of the four directions may be the same dimension, or the following may be adopted: the dimensions of directions of up and down are equal to a first dimension, and the dimensions of directions of left and right are equal to a second dimension. As a result, as shown in FIG. 4, the second cell boundary 206 is created so as to contain all polygon patterns belonging to the cell inside including well pattern, in consideration for the mask margin.

Next, a placement step is executed by the placement means 108 using the second high-speed cell library 103, the low-leakage cell library 104, the netlist 105, the timing constraints 106, and the floor plan data 107. Finally, the layout data 109 for the whole chip is created.

Figure 5:
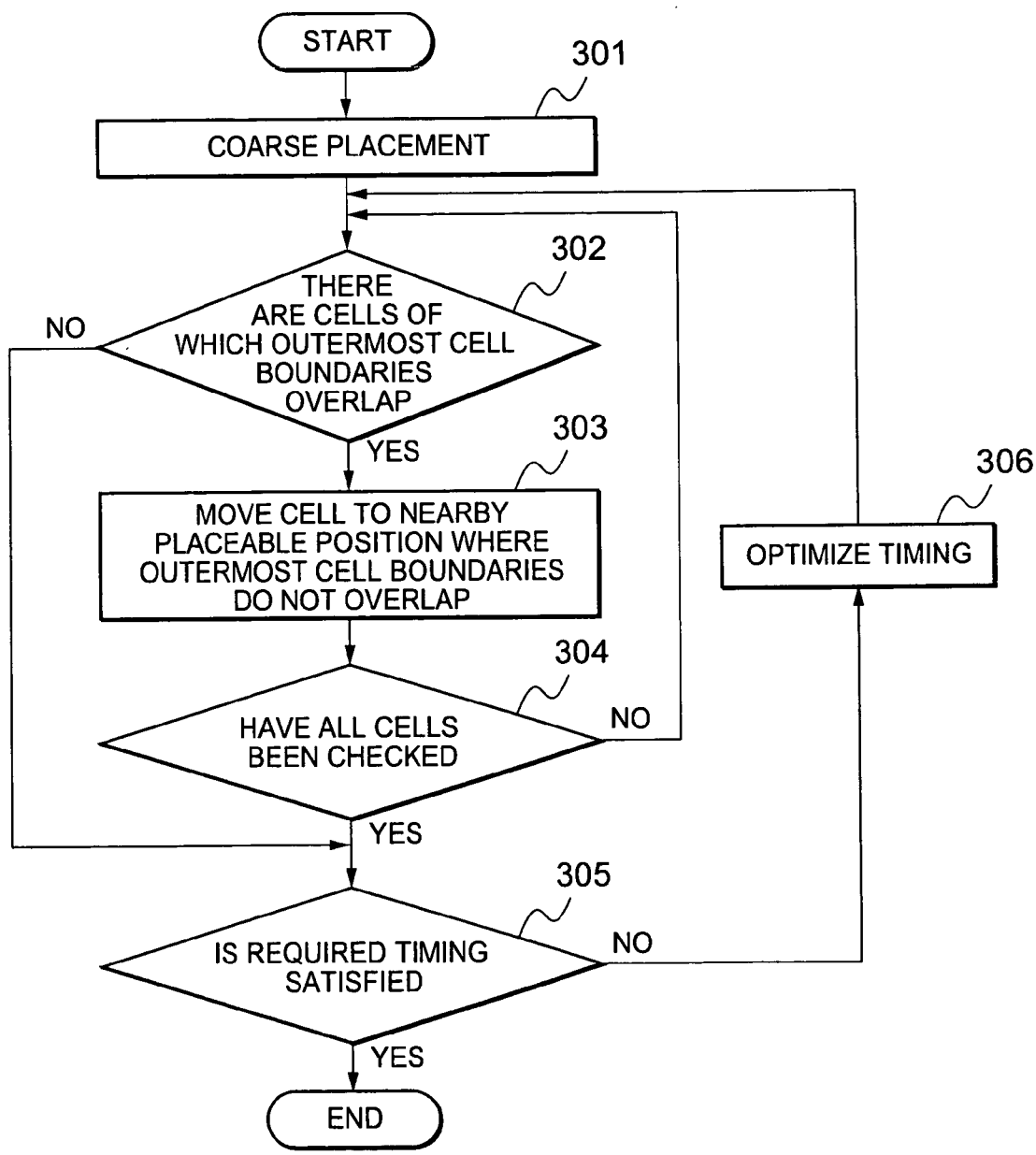
FIG. 5 is a detailed flowchart of a placement process by placement means of the first embodiment.

FIG. 5 is a flowchart of the placement step executed by the placement means 108. First, in Step 301, the placement means 108 coarsely places cells based on the netlist 105 in which circuit connections are described, timing information obtained from the timing constraints 106, and constraint information including a congestion degree of placement obtained from the floor plan data 107. Next, in Step 302, whether the outermost cell boundaries of the respective cells coarsely placed, i.e., the first cell boundaries in the low-leakage cells contained in the low-leakage cell library 104 and the second cell boundaries in the high-speed cells contained in the second high-speed cell library 103, overlap or not is judged. Here, if there are no overlapping cell boundaries, the process goes to Step 305. If there are overlapping cell boundaries, the process goes to Step 303, and the relevant cells are moved to nearby placeable positions where the outermost cell boundaries do not overlap.

Next, in Step 304, whether all cells have been checked or not is judged. If all cells are judged to have been checked, the process goes to Step 305, and the confirmation as to whether the required timing constraints are satisfied or not is executed. Here, the confirmation of the required timing constraints means confirming that the timing constraints are satisfied, by estimating wire lengths in the phase of placement and calculating signal delays to be generated. In the case where the confirmation of the timing constraints is executed after wiring between the cells, feedback is delayed because of long processing time of automatic wiring. Accordingly, whether the timing constraints are satisfied or not is judged in the placement step, which is in the early phase of design. If there remains an unchecked cell in Step 304, the process goes back to Step 302.

After the steps described so far have been completed, whether the timing constraints required for the system are satisfied or not is judged in Step 305. If the timing constraints are not satisfied, the process goes to Step 306 to perform timing optimization 306 and then goes back to Step 302. If the required timing constraints are satisfied in Step 305, the placement step is terminated.

Figure 6:
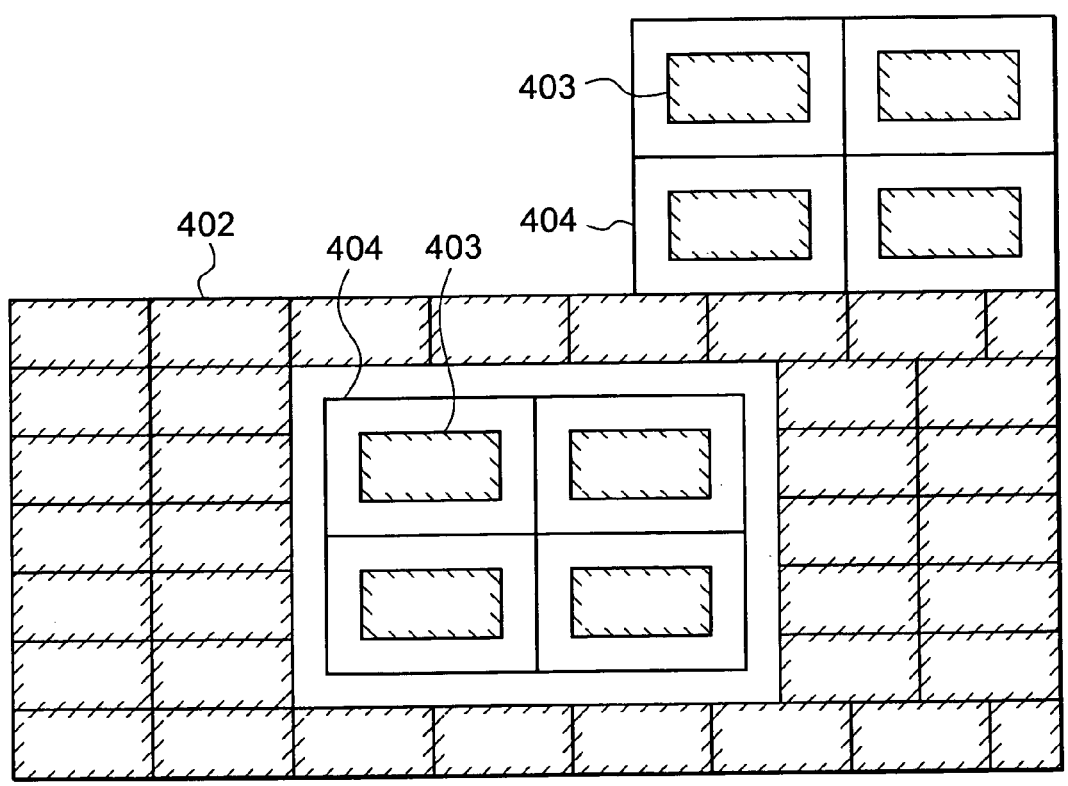
FIG. 6 is a pattern diagram of cell arrangement in a semiconductor integrated circuit realized by the first embodiment.

A pattern diagram of cell placement in the semiconductor integrated circuit obtained through the flow described so far is shown in FIG. 6. In FIG. 6, the low-leakage cell boundaries 402 are the first cell boundaries in the low-leakage cells, the high-speed cell boundaries 403 are the first cell boundaries in the high-speed cells, and the high-speed cell boundaries 404 are the second cell boundaries in the high-speed cells. As shown in FIG. 6, the high-speed cells are arranged while being mixed with the low-leakage cells in a form in which the high-speed cells are surrounded by the low-leakage cells, and distances equal to or larger than the mask margin required in the diffusion process are ensured between the high-speed cells and the low-leakage cells.

In the first embodiment, the second cell boundaries 404 are provided in all high-speed cells, and this second cell boundaries are set as the outermost cell boundaries. Accordingly, the high-speed cells are also placed so as to keep distances from one another. In contrast, a second embodiment of the present invention permits adjacent cells to be placed so that first cell boundaries may come into contact with each other if both of the adjacent cells are low-leakage cells or high-speed cells. This provides a designing method in which cells can be placed in high density.

Figure 7:
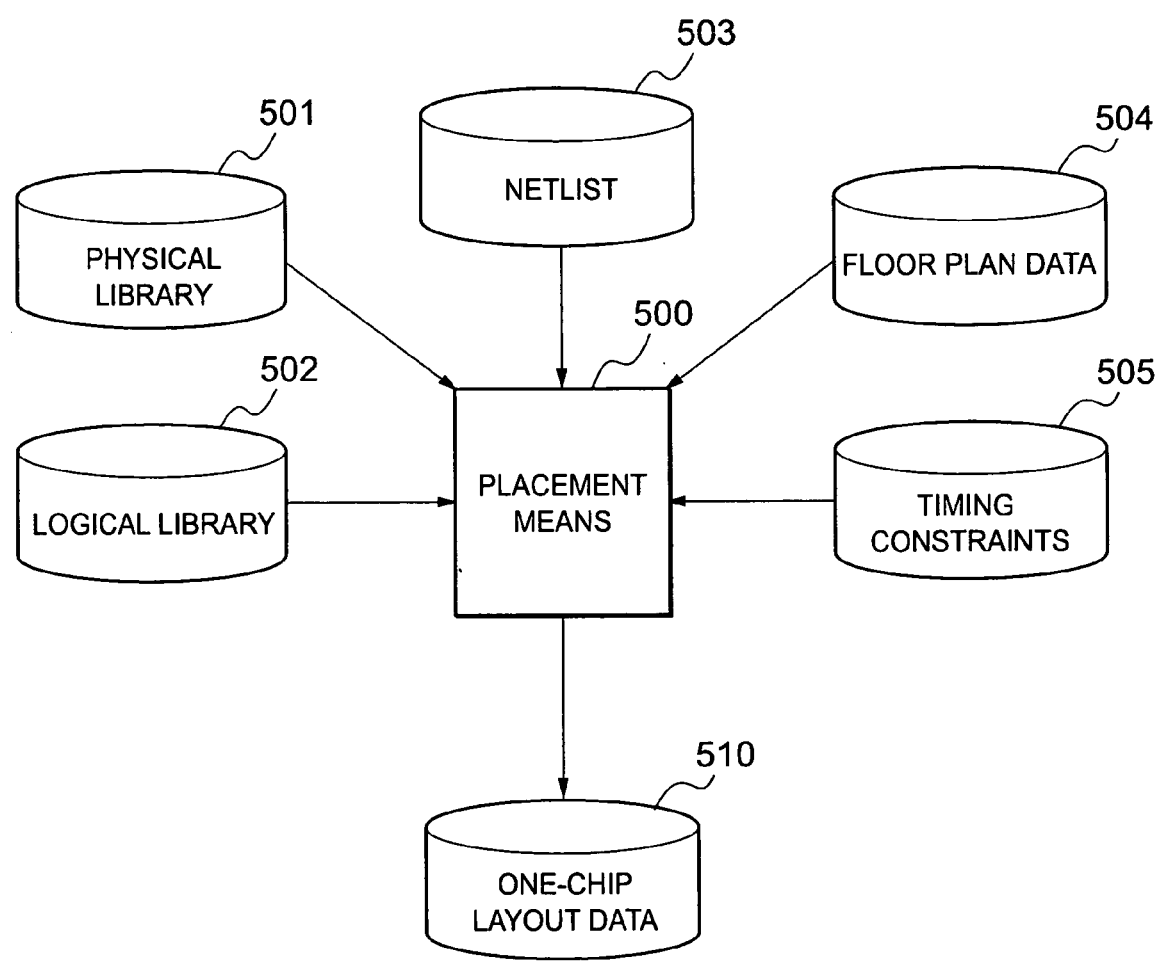
FIG. 7 is a diagram showing the configuration of a designing device according to a second embodiment of the present invention.

FIG. 7 is a diagram showing the configuration of a designing device of the second embodiment of the present invention. In the present embodiment, a physical library 501, a logical library 502, a connection description netlist 503 described by using the foregoing libraries, a floor plan 504 showing a placeable area, and timing constraints 505 which defines operation timing of a circuit are inputted into placement means 500, thus creating chip layout data 510.

Figure 9:
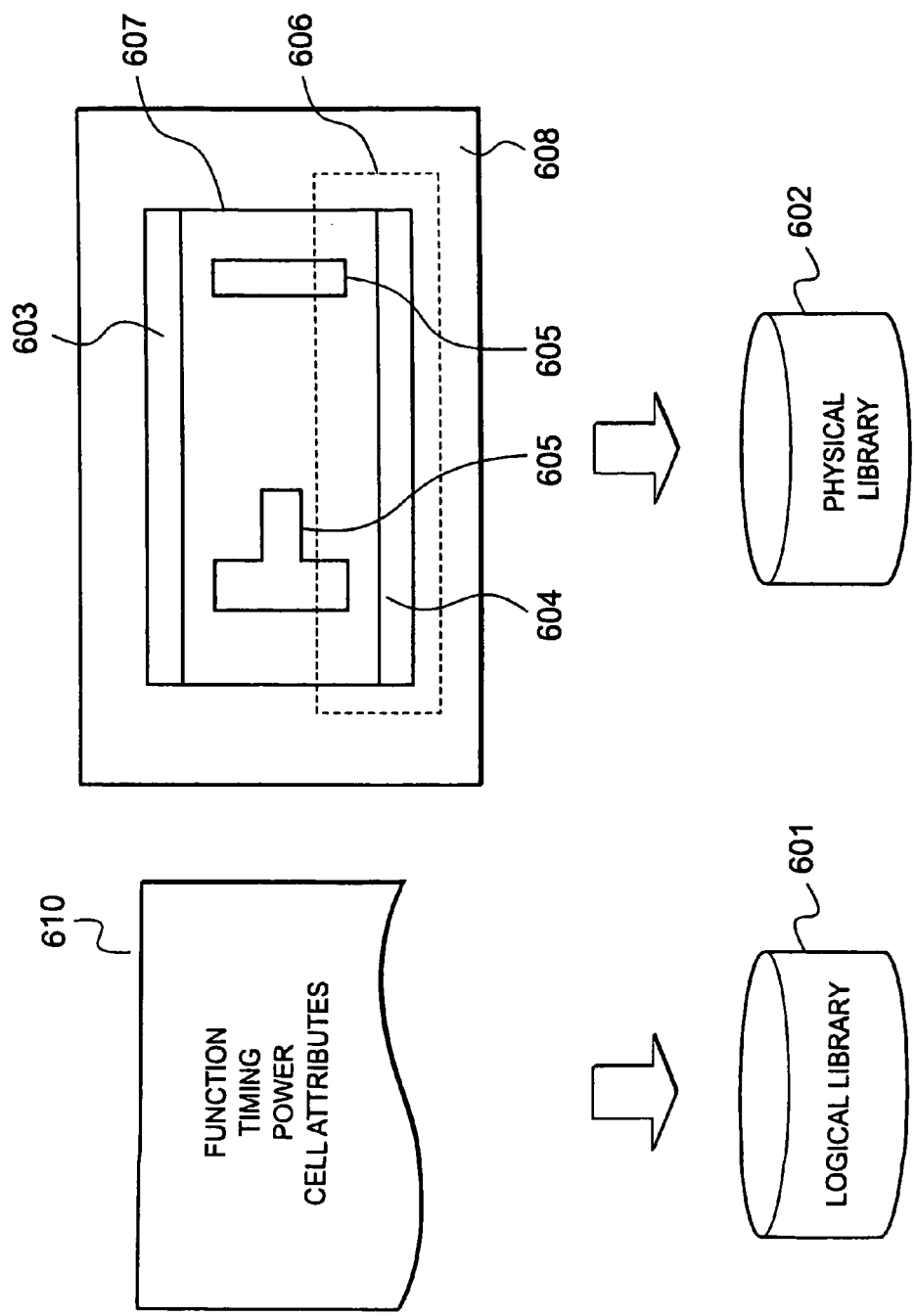
FIG. 9 is a diagram for explaining the configuration of libraries in the second embodiment.

As shown in FIG. 9, the physical library 602 (i.e., the physical library 501 in FIG. 7) stores first cell boundary data 607 and second cell boundary data 608 in addition to physical shape data of power terminals, signal terminals, and the like, for detecting overlapping statuses between cells. That is, in the present embodiment, it is assumed that a cell is created so as to have a first cell boundary indicating a cell frame which contains a power terminal, a ground terminal, an input terminal, and an output terminal inside and a second cell boundary obtained by enlarging the first cell boundary in four directions, and stored in the physical library. Here, the cell frame is defined to include polygon patterns of transistors, wirings (these are not shown in FIG. 9) and terminals. For example, a cell adapted for the present embodiment may be created by adding a second cell boundary 608 obtained by enlarging an original cell frame (i.e., the first cell boundary 607) to a cell stored in a basic library not shown (hereinafter referred to as "basic physical library"), and stored in the physical library 602. The logical library 601 (i.e., the logical library 502 in FIG. 7) has descriptions 610 of a function, timing, power consumption, and the like indicating the operation of the cell, and further has descriptions of cell attributes for distinguishing characteristics of transistors constituting the cell. Note that, in FIG. 9; reference numerals 603, 604, 605, and 606 denote patterns indicating the power terminal, the ground terminal, the signal terminals, and the well region, respectively.

Figure 8:
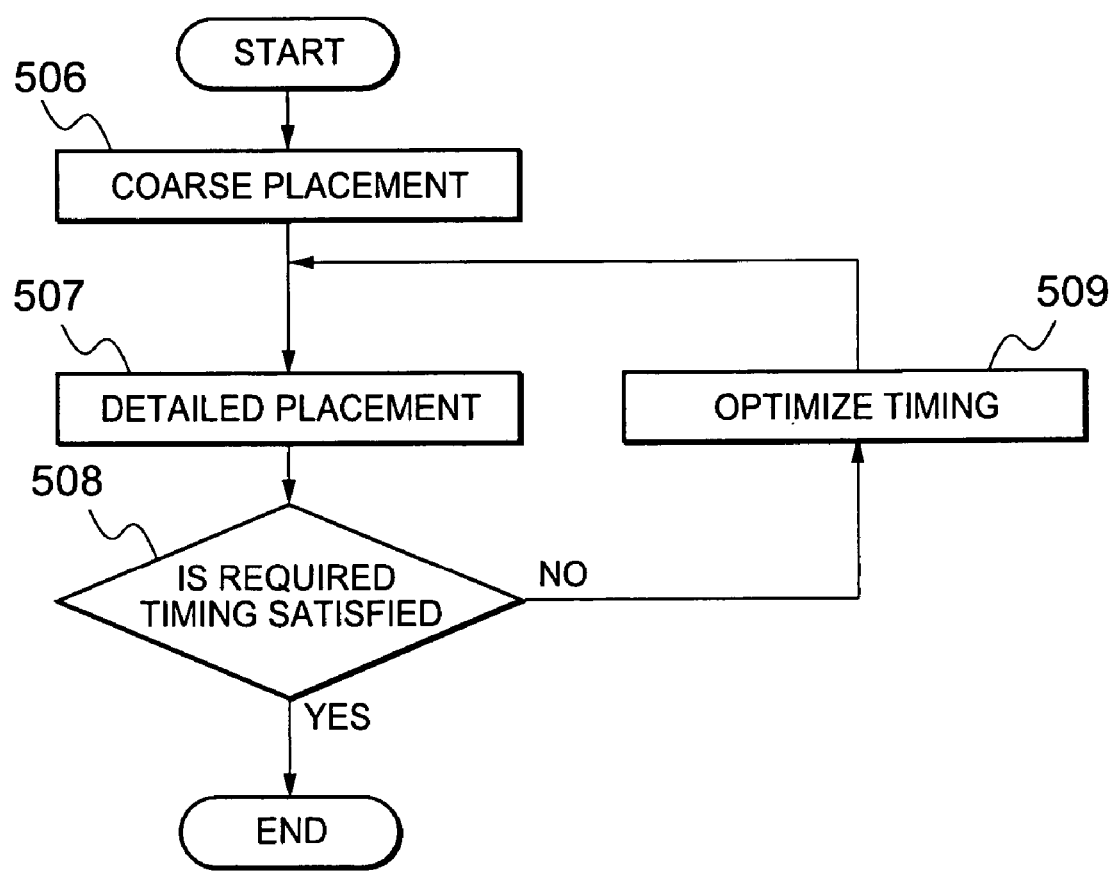
FIG. 8 is a flowchart of a placement process of placement means according to the second embodiment.

FIG. 8 is a flowchart of a placement process by the placement means 500 of the second embodiment. In a coarse placement step 506, cells constituting the netlist 503 are coarsely placed based on connection information described in the netlist 503, timing information obtained from the timing constraints 505, and constraint information including a congestion degree obtained from the floor plan 504. Thereafter, in a detailed placement step 507, if there is an overlap of cell frames in adjacent cells, the cells are moved so that the overlap may be eliminated. In Step 508, whether the required timing constraints are satisfied or not is judged. If the timing constraints has been judged to be satisfied in Step 508, chip layout data 510 is created. If the required timing is not satisfied in Step 508, the process goes to Step 509 to perform improvement of the placement by moving cells and timing optimization by exchanging cells for ones operating at high speed, and then goes back to Step 507.

In the overlap judgment in Step 507 for detailed placement, different criteria are applied to the overlap judgment for the adjacency between cells having different attributes and the overlap judgment for the adjacency between cells having the same attributes. This makes it possible to satisfy distances needed between cells having different attributes.

Next, using FIGS. 9 to 13, the second embodiment of the present invention will be described in detail. In FIG. 9, in each cell stored in the logical library 601, additionally to descriptions 610 of a function, timing, and power, which are logical attributes of the cell, cell attributes of characteristics corresponding to types of characteristics of transistors constituting the cell are described. The cell attributes of characteristics include information as to whether the cell is a high-speed cell or a low-leakage cell, and the like, and are used for distinguishing cells having the same logical function and the same physical layout in the cells but having different characteristics.

In the physical library 602, physical information of terminal diagrams and the like of a power terminal, a ground terminal, an input terminal, and an output terminal contained in a cell, is stored. Moreover, similar to FIG. 4 of the first embodiment, all cells stored in the physical library 602 each have a first cell boundary 607 indicating an original cell frame and a second, enlarged cell boundary 608. Here, the first cell boundary 607 is used for judging the overlap between cell frames in the case where adjacent cells have the same cell attributes, and the second cell boundary 608 is used for judging overlap in the case where adjacent cells have different cell attributes. A cell stored in the physical library 602 maybe created by applying a cell frame enlargement process to a cell stored in a basic physical library (not shown), similarly to the first embodiment. That is, a second cell boundary 608 obtained by enlarging an original cell frame (i.e., a first cell boundary 607) may be added to a cell stored in the basic physical library to be stored in the physical library 602.

Figure 10:
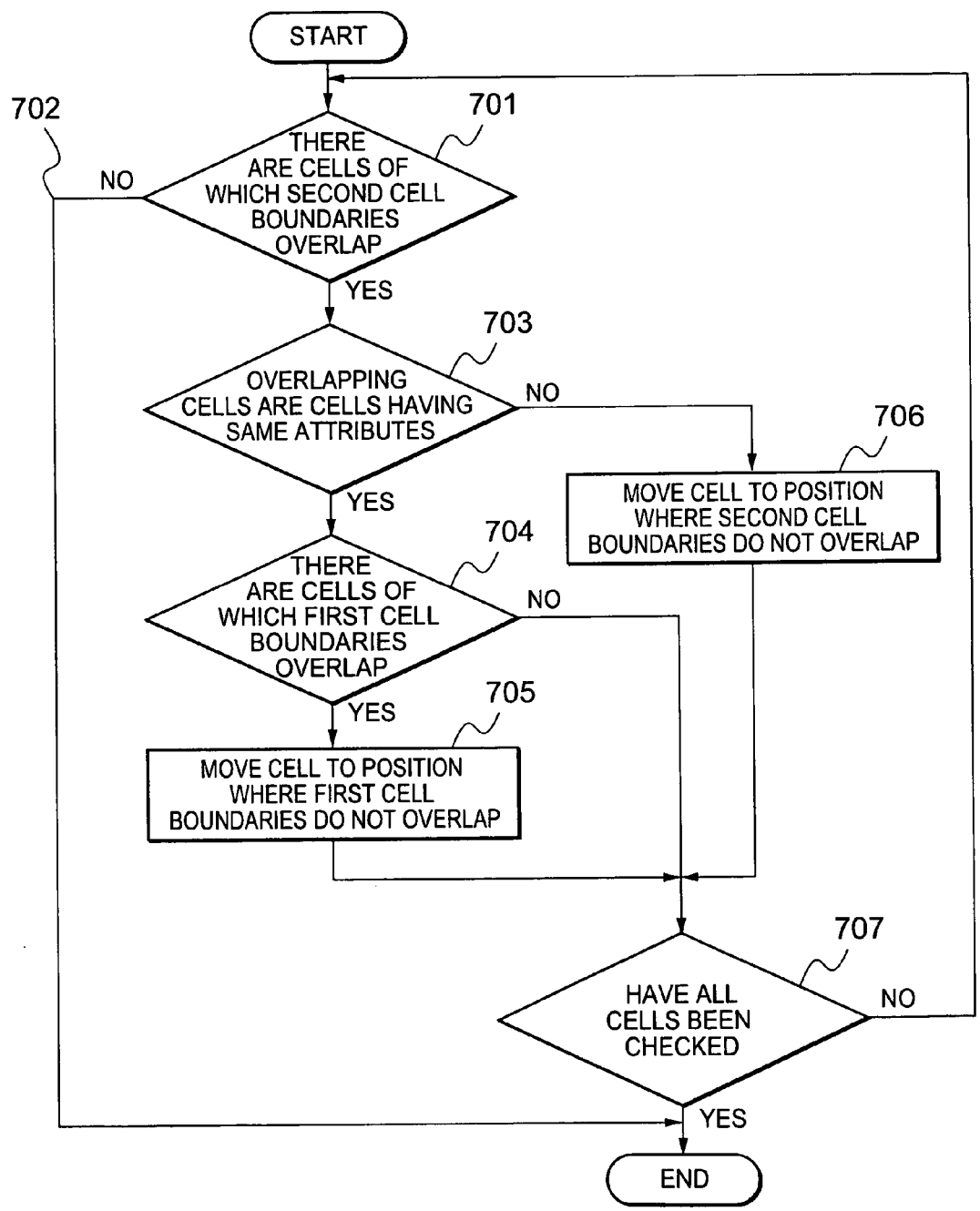
FIG. 10 is a flowchart of detail placement according to the second embodiment.

The detailed placement of Step 507 in FIG. 8 will be described in detail using FIG. 10. First, in Step 701, for the result of the coarse placement in Step 506 of FIG. 8, whether there is a part where a second cell boundary of one cell of adjacent cells breaks into a second cell boundary of the other cell to cause an overlap or not is checked. If there is no overlapping part of second cell boundaries, Step 507 for detailed placement is terminated in Step 702. If there is an overlap of second cell boundaries, the process goes to Step 703, and whether cell attributes of the overlapping cells are the same or not is judged. If the overlapping cells are cells having the same cell attributes, the process goes to Step 704, and whether there is a part where a first cell boundary of one cell breaks into a first cell boundary of the other cell to cause an overlap in the overlapping part of the second cell boundaries or not is checked. Here, if there is an overlap of the first cell boundaries, goes to Step 705, and the overlap of the first cell boundaries is eliminated by moving at least one cell in the vicinity thereof. If there is no overlap of the first cell boundaries in Step 704, the process goes to Step 707.

If cell attributes of the overlapping cells are not the same in Step 703, the process goes to Step 706, and the overlap of the second cell boundaries is eliminated by moving at least one cell in the vicinity thereof. In Step 707, whether all cells have been checked or not is judged. If all cells have not been checked, the process goes back to Step 701, and the steps from Step 701 to Step 706 are repeated until undesirable overlaps of all cells are eliminated.

Figure 11:
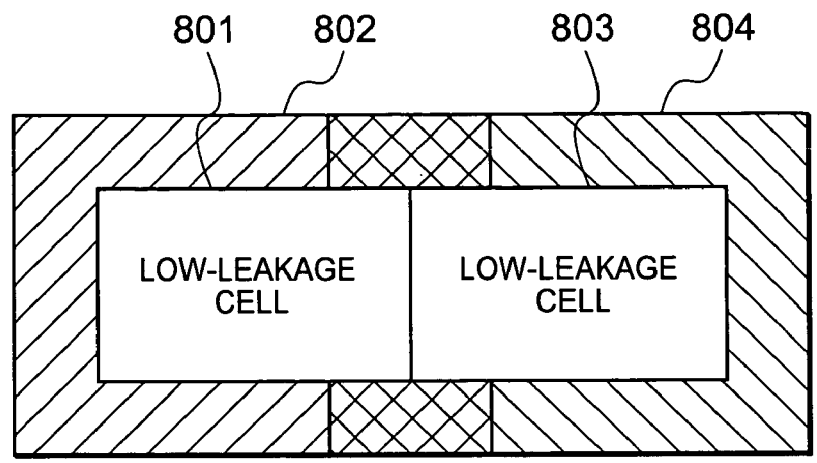
FIG. 11 is a diagram showing adjacent placement of cells having the same cell attributes in the second embodiment.

The placement of cells in the semiconductor integrated circuit obtained in the present embodiment will be described with reference to FIGS. 11, 12, and 13. FIG. 11 is a layout in the case where cells having the same cell attributes are adjacent. A first cell boundary 801 of a first low-leakage cell and a first cell boundary 803 of a second low-leakage cell are placed in contact with each other. Therefore, a second cell boundary 802 of the first low-leakage cell and a second cell boundary 804 of the second low-leakage cell overlap. In the case where cells having the same cell attributes are adjacently placed, the placement shown in FIG. 11 is permitted.

Figure 12:
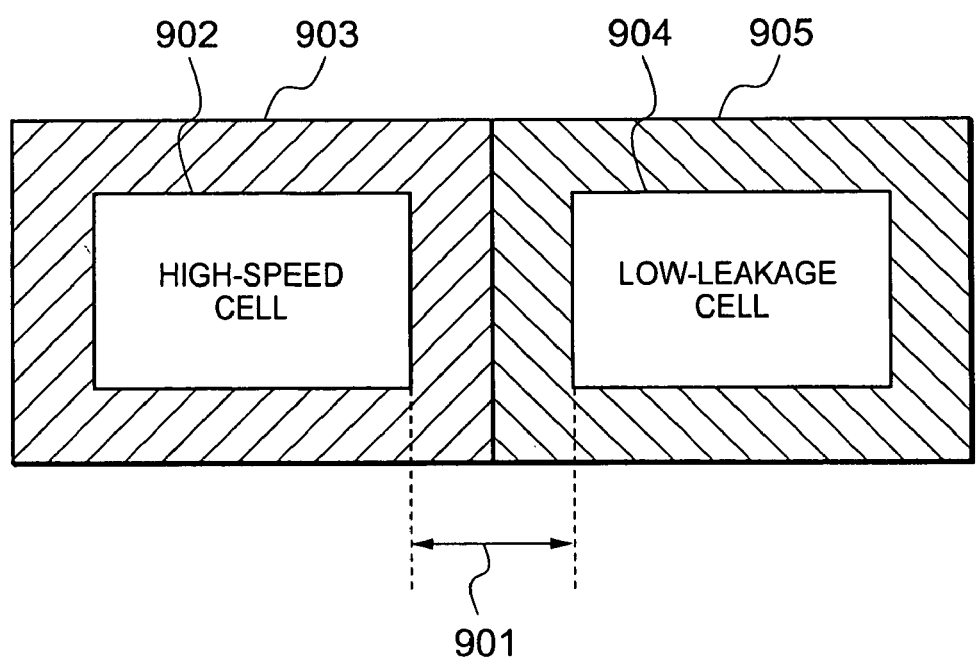
FIG. 12 is a diagram showing adjacent placement of cells having different cell attributes of the second embodiment.

FIG. 12 is a layout in the case where cells having different cell attributes are adjacent. A second cell boundary 903 of a high-speed cell and a second cell boundary 905 of a low-leakage cell are placed in contact with each other. By the above placement, a distance 901 equal to or larger than a distance defined based on a mask margin required in a diffusion process is ensured between a first cell boundary 902, which is an original cell frame of the high-speed cell, and a first cell boundary 904, which is an original cell frame of the low-leakage cell.

Figure 13:
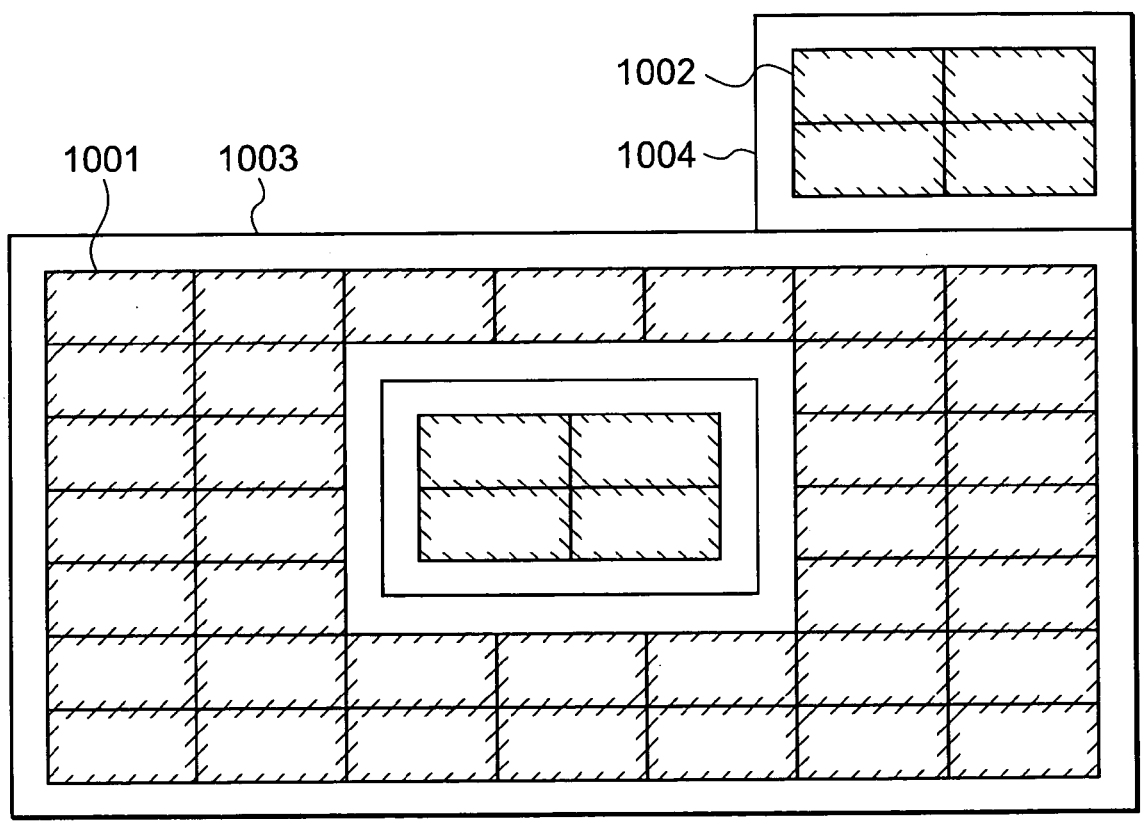
FIG. 13 is a pattern diagram of cell arrangement in a semiconductor integrated circuit realized by the second embodiment.

FIG. 13 is a diagram schematically showing cell arrangement realized by the second embodiment. In FIG. 13, as a distance between a first cell boundary 1001 of a low-leakage cell and a first cell boundary 1002 of a high-speed cell, a distance equal to or larger than a distance defined based on the mask margin required in the diffusion process is ensured because of the existence of a second cell boundary 1003 of the low-leakage cell and a second cell boundary 1004 of the high-speed cell. As described previously, a designing method of the second embodiment is the same as that of the first embodiment in that the mixing arrangement of cells having different cell attributes, such as low-leakage cells and high-speed cells, can be realized. In addition to this, in the designing method of the second embodiment, at a part where cells having different cell attributes are adjacent, a distance defined based on the mask margin can be ensured as the distance between original cell frames of the respective cells. At a part where cells having the same cell attributes are adjacent, the cells can be placed so that original cell frames of the respective cells may be in contact with each other. Accordingly, the designing method of the second embodiment enables cells to be placed in high density compared to that of the first embodiment.

Next, referring to FIGS. 14 and 15, a third embodiment of the present invention will be described. FIG. 14 is a design flowchart of the third embodiment of the present invention. Steps 1106, 1107, 1108, 1109, and 1110 in FIG. 14 are executed by placement means (not shown). The third embodiment is different from the second embodiment of FIG. 8 in that a slit-filling step 1110 is executed after detailed placement has been performed similarly to the placement means 500 of FIG. 7.

The slit-filling step 1110 will be described in detail with reference to FIG. 15. When cells having the same cell attributes are adjacently placed in Step 1107 for detailed placement, there are cases where the cells are placed so that second cell boundaries may overlap in the lateral direction but that first cell boundaries may not be in contact with each other, as shown in the placement result 1201. Here, the lateral direction means the direction in which the power terminal 603 or the ground terminal 604 shown in FIG. 9 extends. Since a slit having a width narrower than a certain width defined in a design rule constitutes a violation of the design rule, a fill cell 1202 having the same width as the width of the slit is prepared and placed so as to fill the slit by executing a fill cell placement step 1211. Similar to the detailed placement described previously, by adding cell attributes also to fill cells, only a fill cell having the same cell attributes is placed in the relevant area as shown in data 1203 after a slit-filling process.

Specifically, as show in FIG. 15, a second cell boundary 1206 of a first low-leakage cell and a second cell boundary 1208 of a second low-leakage cell overlap, but a first cell boundary 1205 of the first low-leakage cell and a first cell boundary 1207 of the second low-leakage cell are not in contact with each other. Therefore, a slit 1204 exists. For filling this slit, the fill cell 1202 having slit-filling data 1209 and a fill cell second boundary 1210 is prepared. By executing the fill cell placement step 1211, the data 1203 after the slit-filling process is obtained in which the slit 1204 is filled with the fill cell 1202.

According to the above, cells having different cell attributes, such as high-speed cells and low-leakage cells, are placed while being mixed with each other. Moreover, in the case where cells having the same cell attributes are adjacently placed, cell placement in high density can be realized by permitting the overlap of second cell boundaries, and a violation of a design rule due to the occurrence of a slit can be eliminated.

The designing method described above in detail may be a computer program for executing respective procedures with a computer. Moreover, the designing method can be realized as a device for executing the computer program of the designing method, e.g., a designing device which is equipped with a memory, an arithmetic unit, a data bus, and the like and which performs automatic layout of a semiconductor integrated circuit.

Adopting the present invention makes it possible to realize a semiconductor integrated circuit in which a plurality of types of cells, e.g., high-speed cells and low-leakage cells, constituted by transistors having different characteristics for the respective types of cell are arranged in a mixed manner, by automatic layout using a computer. Accordingly, a semiconductor integrated circuit having both of high-speed operation and low-leakage power can be developed in a short period.

What is claimed is:

1. A method of designing a semiconductor integrated circuit having a plurality of types of cells constituted by using transistors having different characteristics for the respective types of cell, the method comprising:
creating at least one type of cell out of the plurality of types of cells, as a cell having a first cell boundary, which indicates a cell frame defined including polygon patterns of transistors, wirings between the transistors and terminals, and a second cell boundary obtained by enlarging the first cell boundary in four directions; and
placing the cells so that outermost cell boundaries of different types of cells do not overlap one another.

2. The method according to claim 1, wherein placing the cells comprises:
executing coarse placement of the cells based on the netlist and the constraint information; and
eliminating an overlap, if there are cells of which outermost cell boundaries overlap in a result of the coarse placement, by moving at least one of the relevant cells.

3. The method according to claim 2, wherein the cell having the second cell boundary comprises a high-speed cell including a high-speed transistor.

4. The method according to claim 1, wherein the plurality of types of cells are stored in a single logical library while being distinguished depending on cell attributes.

5. The method according to claim 4, wherein a cell in which a second cell boundary is defined corresponding to the cell attributes is created and stored in a physical library.

6. The method according to claim 5, wherein placing the cells comprises:
coarsely placing the plurality of cells each having the first cell boundary and the second cell boundary based on the netlist and the constraint information;
eliminating an overlap of the first cell boundaries, if there are cells which have the same cell attributes and of which first cell boundaries overlap, by moving at least one of the relevant cells; and
eliminating an overlap of the second cell boundaries, if there are cells which have different cell attributes and of which second cell boundaries overlap, by moving at least one of the relevant cells.

7. The method according to claim 6, wherein in placing the cells, when the cells having the same cell attributes are placed so as not to be in contact with each other in a lateral direction of the cells and to be apart from each other by a cell distance equal to or smaller than a predetermined value, a fill cell having a width fit for the cell distance and the same cell attributes is placed in an inserted manner.

8. A device for designing a semiconductor integrated circuit having a plurality of types of cells constituted by using transistors having different characteristics for the respective types of cell, the device comprising,
a cell library in which the plurality of types of cells are stored while having cell attributes distinguished from one another and having first cell boundaries indicating cell frames corresponding to the cell attributes and second cell boundaries obtained by enlarging the first cell boundaries in four directions, and
placement means having functions: inputting a netlist and constraint information to execute placement of the cells using cell data stored in the library; eliminating an overlap of the first cell boundaries, if there are cells which have the same cell attributes and of which first cell boundaries overlap, by moving at least one of the relevant cells; and eliminating an overlap of the second cell boundaries, if there are cells which have different cell attributes and of which second cell boundaries overlap, by moving at least one of the relevant cells.

9. The device according to claim 8, wherein the placement means further has a function of, when the cells having the same cell attributes are placed so as not to be in contact with each other in a lateral direction of the cells and to be apart from each other by a cell distance equal to or smaller than a predetermined value, placing a fill cell having a width fit for the cell distance and the same cell attributes in an inserted manner.

10. A method of designing a semiconductor integrated circuit comprising:
    preparing a first cell library having first and second cells, each of said first and second cells having first and second cell boundaries, said second cell boundary encompassing said first cell boundary;
    preparing a second cell library having a third cell, said third cell having third and fourth cell boundaries, said fourth cell boundary encompassing said third cell boundary;
    placing said first cell and said second cell adjacently with each other without overlapping said first cell boundaries of each and with overlapping said second cell boundaries of each; and
    placing said first cell and said third cell adjacently with each other without overlapping said second cell boundary of said first cell and said fourth cell boundary of said third cell.

11. The method according to claim 10, wherein
    said first and second cells have the same cell attribute with each other; and
    said first and third cells have different cell attributes with each other.

12. The method according to claim 11, wherein
    transistors included in said first and second cells comprise low-leakage type transistors; and
    transistors included in said third cell comprise high-speed type transistor.

13. The method according to claim 10, further comprising
    preparing said second cell library having a fourth cell, said fourth cell having said third and fourth cell boundaries,
    placing said third and fourth cells adjacently with each other without overlapping said third cell boundaries of each and with overlapping said fourth cell boundaries of each.

14. The method according to claim 10, wherein
    each of said first cell boundaries of said first and second cells encompassing therewithin polygonal patterns of transistors, wirings between the transistors and terminals.

15. The method according to claim 14, wherein
    said third cell boundary encompass therewithin polygonal patterns of transistors, wirings between the transistors and terminals.

16. The method according to claim 10, wherein
    said first cell boundary and said second cell boundary are apart from each other by a first distance; and
    said third cell boundary and said second cell boundary are apart from each other by a second distance.

17. The method according to claim 16, wherein
    said first and second distances are determined based on a mask margin.

* * * * *